United States Patent
Chang

(10) Patent No.: US 7,635,652 B2
(45) Date of Patent: Dec. 22, 2009

(54) MASK WITH HYDROPHOBIC SURFACE

(75) Inventor: Chih-Wing Chang, Tainan (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 395 days.

(21) Appl. No.: 11/717,127

(22) Filed: Mar. 13, 2007

(65) Prior Publication Data

US 2008/0233488 A1  Sep. 25, 2008

(51) Int. Cl.
*H01L 21/31* (2006.01)
(52) U.S. Cl. .................. 438/758; 438/787; 438/945; 148/DIG. 106
(58) Field of Classification Search .............. 438/758, 438/787–790, 945, 948; 427/282; 430/5; 216/41; 148/DIG. 106
See application file for complete search history.

(56) References Cited

U.S. PATENT DOCUMENTS

| | | | |
|---|---|---|---|
| 2004/0241896 A1* | 12/2004 | Zhou et al. | 438/48 |
| 2006/0057851 A1* | 3/2006 | Wong et al. | 438/694 |
| 2006/0257751 A1* | 11/2006 | Eggers et al. | 430/5 |

* cited by examiner

*Primary Examiner*—Kevin M Picardat
(74) *Attorney, Agent, or Firm*—Birch, Stewart, Kolasch & Birch, LLP

(57) ABSTRACT

A mask with hydrophobic surface. The mask includes a substrate, a plurality of patterns formed on the substrate, and a self-assembled monolayer (SAM) formed on the substrate exposed by the patterns. The self-assembled monolayer includes an alkyltrichlorosilane-based layer such as octadecyltrichlorosilane (OTS) or perfluorodecyltrichlorosilane (FDTS) and formed by vapor process or solution process.

11 Claims, 1 Drawing Sheet

MASK WITH HYDROPHOBIC SURFACE

BACKGROUND OF THE INVENTION

1. Field of the Invention

The invention relates to a mask, and in particular to a mask with hydrophobic surface.

2. Description of the Related Art

One cause of mask malfunction is contaminants formed thereon, that is, precipitate. The main components of the precipitate are ammonium sulfate or hydrocarbon organic compounds. Mask compositions, mask clean condition, mask storage condition, or environmental exposure are related to precipitate formation. Currently, methods have been provided to solve the precipitate issue, for example, reducing total concentration of sulfur and ammonia within the environment or using low-outgassing material to prepare and store masks. However, as the wavelength of the exposure source is reduced from 254 nm to 193 nm, photo-induced chemical reaction occurs more easily in the airtight space between the pellicle and mask, resulting in more serious precipitate formation.

FIG. 1 shows precipitate formation on a conventional mask surface. The mask 1 comprises a substrate 2, a plurality of patterns 3 formed on the substrate 2, and a pellicle 4 mounted on the substrate 2 through a pellicle frame 5. Precipitate 6 is formed on the substrate 2 due to highly reactive environment and high surface energy on substrate.

To prolong mask lifetime, development of methods to avoid precipitate formation on the mask surface is required. Reducing the surface energy of the mask to create a hydrophobic and chemically inert surface is a feasible aspect thereof.

BRIEF SUMMARY OF THE INVENTION

The invention provides a mask with hydrophobic surface comprising a substrate, a plurality of patterns formed on the substrate, and a self-assembled monolayer (SAM) formed on the substrate exposed by the patterns.

The invention provides a mask with hydrophobic surface comprising a substrate, a self-assembled monolayer (SAM) formed on the substrate, and a pellicle mounted on the substrate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
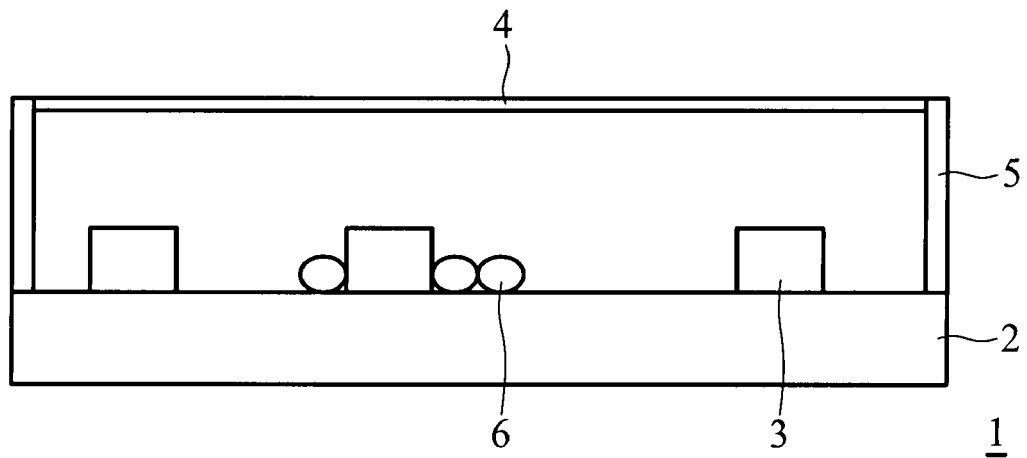
FIG. 1 is a cross section of a conventional mask with precipitate formation.
Figure 2:
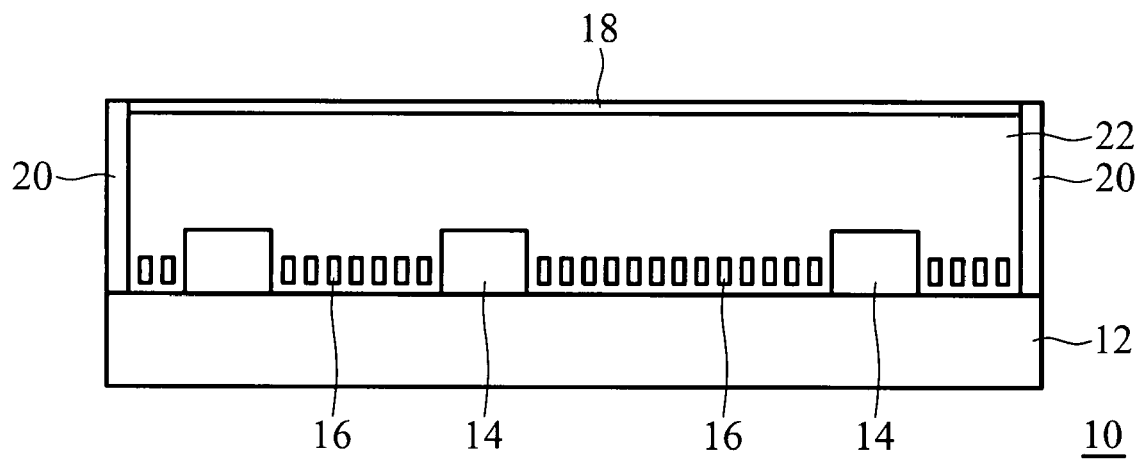
FIG. 2 is a cross section of a SAM-modified mask of the invention.

In an embodiment, a mask with hydrophobic surface is provided. As shown in FIG. 2, a mask 10 comprises a substrate 12, a plurality of patterns 14 formed on the substrate 12, and a self-assembled monolayer (SAM) 16 formed on the substrate 12 exposed by the patterns 14.

The substrate 12 may be made of quartz. The patterns 14 may be made of chromium. The self-assembled monolayer (SAM) 16 may be an alkyltrichlorosilane-based layer such as octadecyltrichlorosilane (OTS) or perfluorodecyltrichlorosilane (FDTS). The self-assembled monolayer is a hydrophobic layer. Other hydrophobic layers such as fluorocarbon layer may also be used.

A pellicle 18 may further be mounted on the substrate 12 through a pellicle frame 20 to form a space 22 containing the patterns 14 and the self-assembled monolayer (SAM) 16. The pellicle 18 may be made of nitrocellulose.

Another embodiment of a method of fabricating a mask with hydrophobic surface is provided, still referring to FIG. 2. A substrate 12 is provided. A plurality of patterns 14 are then formed on the substrate 12. Next, a self-assembled monolayer (SAM) 16 is formed on the substrate 12 exposed by the patterns 14. A pellicle 18 is then mounted on the substrate 12 through a pellicle frame 20.

The self-assembled monolayer is formed on the substrate 12 by, for example, vapor process or solution process. A fluorocarbon layer may be used as a hydrophobic layer coated on the substrate 12. The fluorocarbon layer is formed on the substrate 12 by, for example, plasma enhanced chemical vapor deposition (PECVD) or spin coating.

In an embodiment, the self-assembled monolayer (SAM) is formed by vapor process. In the vapor process, two critical steps are required. One is self-assembled monolayer (SAM) formation. The other is condensation. In the SAM formation, initial molecules such as octadecyltrichlorosilane (OTS) or perfluorodecyltrichlorosilane (FDTS) are reacted with substrate surface such as silicon substrate surface (containing such as hydroxyl groups (OH)) to form such as a Si—O—Si bond between OTS or FDTS and silicon substrate. After hydrolysis, two of OTS or FDTS bonded on the substrate are further condensed to form a Si—O—Si bond therebetween. Finally, an aggregated self-assembled monolayer (SAM) is formed on the substrate. In the vapor process, water content and deposition solvent are critical variables.

In an embodiment, the self-assembled monolayer (SAM) is formed by solution process. In the solution process, four critical steps comprising sacrificial layer etching, surface oxidation, SAM formation, and rinse and dry are required. In the sacrificial layer etching, an etching solution such as concentrated HF is used. In the surface oxidation, a rinse solution such as $H_2O$ or $H_2O_2$ is used. In the SAM formation, a rinse solution such as 2-propanol, carbon tetrachloride, or isooctane is used. Also, an octadecyltrichlorosilane (OTS) or perfluorodecyltrichlorosilane (FDTS) solution is used in this step to form SAM. In the rinse and dry, a rinse solution such as 2-propanol or $H_2O$ is used. Specifically, all of the rinse solution is gentle dilution. The substrate is not removed from the liquid phase until the last step.

The fluorocarbon layer, similar to hydrophobic and chemically inert Teflon, formed by PECVD or spin coating creates a low-surface-energy surface. Generally, material surface can also be modified by the self-assembled monolayer (SAM). Alkyltrichlorosilane-based SAM such as octadecyltrichlorosilane (OTS) or perfluorodecyltrichlorosilane (FDTS) is the most popular for $SiO_2$ surface. Compared to OTS self-assembled monolayer, FDTS self-assembled monolayer is more hydrophobic due to multi-fluorine substitution, with higher chemical and thermal stability. The mask with chemical inertia and low-surface-energy surface modified by the self-assembled monolayer (SAM) avoids precipitate formation, prolonging mask lifetime.

EXAMPLE 1

SAM Modification (1)

In the sacrificial layer etching, the quartz substrate was etched using concentrated HF solution for 10 min. Next, the surface oxidation was performed. The substrate was rinsed with $H_2O$ for 10 min, with $H_2O_2$ for 10 min, and with $H_2O$ for 5 min. Next, the SAM formation was performed. The substrate was rinsed with 2-propanol for 5 min, with carbon tetrachloride for 20 min, with octadecyltrichlorosilane (OTS) solution for 15 min, with carbon tetrachloride for 20 min, and with 2-propanol for 5 min. Finally, rinse and dry was performed. The substrate was rinsed with 2-propanol for 5 min and $H_2O$ for 5 min. After removing the substrate from water, the SAM modification is completed.

EXAMPLE 2

SAM Modification (2)

In the sacrificial layer etching, the quartz substrate was etched using concentrated HF solution for 10 min. Next, the surface oxidation was performed. The substrate was rinsed with $H_2O$ for 10 min, with $H_2O_2$ for 15 min, and with $H_2O$ for 5 min. Next, the SAM formation was performed. the substrate was rinsed with 2-propanol for 5 min, with isooctane for 10 min, with perfluorodecyltrichlorosilane (FDTS) solution for 10 min in $N_2$ dry box, with isooctane for 10 min, and with 2-propanol for 5 min. Finally, the rinse and dry was performed. The substrate was rinsed with 2-propanol for 5 min and $H_2O$ for 5 min. After removing the substrate from water, the SAM modification is completed.

EXAMPLE 3

Potential of SAM-Modified Surface (1)

Two substrates were provided. One was a non-SAM-modified substrate. The other was a SAM-modified substrate. The two substrates were simultaneously exposed under $H_2SO_4$ and $NH_4OH$ environment for 17 hours. The results of precipitate formation are shown in Table 1.

TABLE 1

| Sample type | Deposition condition | $SO_4^{2-}$ | $NH_4^+$ | Remark |
|---|---|---|---|---|
| | | | | Unit: ng/substrate |
| Non-SAM-modified substrate | | 1787 | 387 | Under $H_2SO_4$ & $NH_4OH$ environment |
| SAM-modified substrate | 5° C., 40 min | 22 | 112 | |

From Table 1, the potential of the SAM-modified surface for inhibiting the precipitate formation is proved preliminarily.

EXAMPLE 4

Potential of SAM-Modified Surface (2)

Three glass beakers were provided. The first was a hydrophilic glass beaker. The second was a hydrophobic glass beaker modified by SAM. The third was a hydrophobic beaker modified by Teflon. The three glass beakers were filled with $H_2SO_4$ and then received $NH_3$ vapor therein. For the hydrophilic glass beaker, precipitate was immediately formed on the wall thereof after exposure under $H_2SO_4$ and $NH_4OH$ environment. For the SAM-modified hydrophobic glass beaker, precipitate formation rate was apparently reduced. For the Teflon-modified hydrophobic glass beaker, most of the precipitate was formed on the surface of the $H_2SO_4$ solution.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask with hydrophobic surface, comprising:
    a substrate;
    a plurality of patterns formed on the substrate; and
    a self-assembled monolayer (SAM) formed on the substrate exposed by the patterns, wherein the self-assembled monolayer comprises perfluorodecyltrichlorosilane (FDTS).

2. The mask with hydrophobic surface as claimed in claim 1, wherein the substrate is made of quartz.

3. The mask with hydrophobic surface as claimed in claim 1, wherein the pattern is made of chromium.

4. The mask with hydrophobic surface as claimed in claim 1, wherein the self-assembled monolayer is formed by vapor process.

5. The mask with hydrophobic surface as claimed in claim 1, wherein the self-assembled monolayer is formed by solution process.

6. A mask with hydrophobic surface, comprising:
    a substrate;
    a plurality of patterns formed on the substrate; and
    a fluorocarbon layer formed on the substrate exposed by the patterns.

7. The mask with hydrophobic surface as claimed in claim 6, wherein the substrate is made of quartz.

8. The mask with hydrophobic surface as claimed in claim 6, further comprising a pellicle mounted on the substrate.

9. The mask with hydrophobic surface as claimed in claim 8, wherein the pellicle is nitrocellulose.

10. The mask with hydrophobic surface as claimed in claim 8, wherein the pellicle is mounted on the substrate through a pellicle frame.

11. The mask with hydrophobic surface as claimed in claim 6, wherein the fluorocarbon layer is Teflon.

* * * * *